(12) United States Patent
Murti et al.

(10) Patent No.: US 6,774,393 B2
(45) Date of Patent: Aug. 10, 2004

(54) FIELD EFFECT TRANSISTOR

(75) Inventors: Dasarao K. Murti, Mississauga (CA); Beng S. Ong, Mississauga (CA); James M. Duff, Mississauga (CA)

(73) Assignee: Xerox Corporation, Stamford, CT (US)

( * ) Notice: Subject to any disclaimer, the term of this patent is extended or adjusted under 35 U.S.C. 154(b) by 128 days.

(21) Appl. No.: 10/397,561

(22) Filed: Mar. 25, 2003

(65) Prior Publication Data

US 2003/0228718 A1 Dec. 11, 2003

Related U.S. Application Data

(62) Division of application No. 10/167,683, filed on Jun. 11, 2002.

(51) Int. Cl.[7] .......................... H01L 35/24; H01L 51/00
(52) U.S. Cl. ............... 257/40; 257/57; 257/66
(58) Field of Search .................. 257/40, 57, 66, 257/72, 347, 369, 406

(56) References Cited

U.S. PATENT DOCUMENTS

| | | | |
|---|---|---|---|
| 4,687,589 A | 8/1987 | Block et al. ................. 252/73 |
| 5,290,963 A | 3/1994 | Mishima et al. ............. 556/413 |
| 5,352,554 A | 10/1994 | Mishima et al. ............. 430/59 |
| 5,405,725 A | 4/1995 | Nakamura et al. ............. 430/58 |
| 5,482,811 A | 1/1996 | Keoshkerian et al. ........ 430/135 |
| 5,516,617 A | 5/1996 | Petropoulos et al. ........ 430/133 |
| 5,531,872 A | 7/1996 | Forgit et al. ................. 204/486 |
| 5,563,261 A | 10/1996 | Keoshkerian et al. ....... 540/141 |
| 5,783,519 A | 7/1998 | Morrison et al. ........... 503/227 |
| 5,876,887 A | 3/1999 | Chambers et al. ........... 430/58 |
| 5,946,551 A | 8/1999 | Dimitrakopoulos et al. .. 438/99 |
| 6,107,117 A | 8/2000 | Bao et al. ..................... 438/99 |
| 6,165,660 A | 12/2000 | Chambers et al. ........... 430/56 |
| 6,180,309 B1 | 1/2001 | Maty et al. ................. 430/130 |
| 6,252,245 B1 | 6/2001 | Katz et al. .................... 257/40 |
| 6,319,645 B1 | 11/2001 | Murti et al. .............. 430/58.65 |
| 6,639,281 B2 * | 10/2003 | Kane et al. ................. 257/350 |
| 2002/0135039 A1 | 9/2002 | Yang ........................... 257/499 |

OTHER PUBLICATIONS

Zhenan Bao, "Materials and Fabrication Needs for Low–Cost Organic Transistor Circuits" Adv. Mater. vol. 12, No. 3, pp. 227–230 (2000).

C.D. Dimitrakopoulos et al., "Organic thin–film transistors: A review of recent advances" IBM J. RES. & DEV. Vol. 45, No. 1, pp. 11–27 (Jan. 2001).

* cited by examiner

*Primary Examiner*—Long Pham
*Assistant Examiner*—Hoai Pham
(74) *Attorney, Agent, or Firm*—Zosan S. Soong

(57) ABSTRACT

A field effect transistor composed of:
  an insulating layer;
  a gate electrode;
  a semiconductor layer including an organic semiconductor material and a binder resin;
  a source electrode; and
  a drain electrode,
  wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer.

14 Claims, 2 Drawing Sheets

FIELD EFFECT TRANSISTOR

CROSS REFERENCE TO RELATED APPLICATIONS

This application is a divisional application of co-pending U.S. application Ser. No. 10/167,683 (filed Jun. 11, 2002), from which priority is claimed, the disclosure of which is totally incorporated herein by reference.

BACKGROUND OF THE INVENTION

Organic materials have been investigated for use as the semiconductor layers in thin film field effect transistors ("FETs"). Organic materials are attractive because they are easily processable and are compatible with the plastic substrates on which thin film FETs can be formed. Such advantages are important when fabricating low cost, large area devices. The conventional approach to forming the organic semiconductor layer is to employ a solution where the organic material is dissolved in a solvent. The semiconductor layer is then formed by coating the solution of the organic material followed by evaporating off the solvent. Using a solution based approach where an organic material is soluble in a solvent, however, limits the choice of organic materials for the semiconductor layer. Thus, there is a need which the present invention addresses for new techniques to form organic semiconductor layers to expand the choice of organic materials that can be used in the semiconductor layers.

The following documents may be relevant to the present invention:

Bao et al., U.S. Pat. No. 6,107,117;

Katz et al., U.S. Pat. No. 6,252,245 B1;

Dimitrakopoulos et al., U.S. Pat. No. 5,946,551;

Keoshkerian et. al. U.S. Pat. No. 5,482,811;

Keoshkerian et. al. U.S. Pat. No. 5,563,261;

Murti et. al. U.S. Pat. No. 6,319,645 B1;

Zhenan Bao, "Materials and Fabrication Needs for Low-Cost Organic Transistor Circuits" Adv. Mater. Vol. 12, No. 3, pp. 227–230 (2000); and C. D. Dimitrakopoulos et al., "Organic thin-film transistors: A review of recent advances" IBM J. RES. & DEV. Vol. 45, No. 1, pp. 11–27 (January 2001).

SUMMARY OF THE INVENTION

The present invention is accomplished in embodiments by providing a process comprising:

creating a dispersion including: (a) a continuous phase comprising a solvent, a binder resin at least substantially dissolved in the solvent, and (b) a disperse phase comprising an organic semiconductor material; and solution coating using the dispersion to form a semiconductor layer of an electronic device, wherein the semiconductor layer comprises the organic semiconductor material and the binder resin.

In further embodiments of the present invention, there is a process for fabricating a field effect transistor comprising:

forming an insulating layer, a gate electrode, a semiconductor layer, a source electrode, and a drain electrode, wherein the forming the semiconductor layer is accomplished by solution coating using a dispersion including (a) a continuous phase comprising a solvent, a binder resin at least substantially dissolved in the solvent, and (b) a disperse phase comprising an organic semiconductor material, to form the semiconductor layer including the organic semiconductor material and the resin binder, wherein the insulating layer, the gate electrode, the semiconductor layer, the source electrode, and the drain electrode are formed in any sequence as long as the gate electrode and the semiconductor layer both contact the insulating layer, and the source electrode and the drain electrode both contact the semiconductor layer.

The present invention is accomplished in additional embodiments by providing a field effect transistor comprising:

an insulating layer;

a gate electrode;

a semiconductor layer including an organic semiconductor material and a resin binder;

a source electrode; and a drain electrode, wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer.

BRIEF DESCRIPTION OF THE DRAWINGS

Other aspects of the present invention will become apparent as the following description proceeds and upon reference to the Figures which represent illustrative embodiments.

Unless otherwise noted, the same reference numeral in different Figures refers to the same or similar feature.

DETAILED DESCRIPTION

Figure 1:
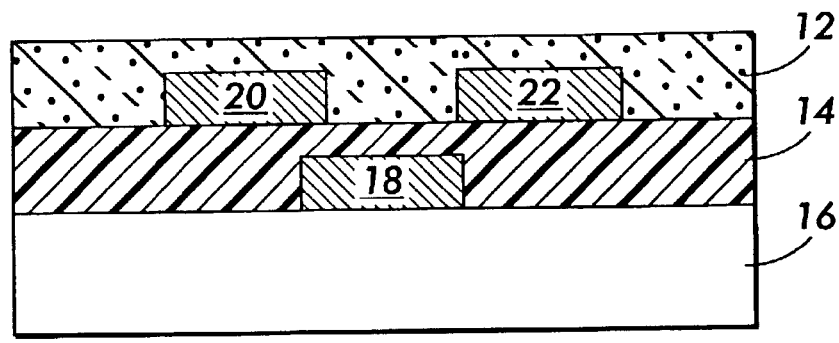
FIG. 1 represents a first embodiment of a field effect transistor made using the present process.

The present process involves creating a dispersion composed of (a) a continuous phase comprising a solvent, a binder resin, and an optional dispersing agent, and (b) a disperse phase comprising an organic semiconductor material. In embodiments, the semiconductor material is considered generally insoluble in the solvent. However, the degree of solubility of the semiconductor material in the solvent may vary in embodiments for example from 0% to about 20% solubility, particularly from 0% to about 5% solubility.

The binder resin and the optional dispersing agent are at least substantially soluble in the solvent, especially completely dissolved in the solvent. However, the degree of solubility of the binder resin and the dispersing agent in the solvent may vary in embodiments from, for example, about 95% to 100% solubility, particularly from about 99% to 100% solubility.

In embodiments, the solubility of a given solid in a specific solvent may be generally determined by a simple gravimetric technique that involves: (1) stirring a pre-weighed amount of solid in a known volume or weight of solvent at a prescribed temperature for a time sufficient to ensure that the dissolution process is complete; (2) filtering the resultant mixture to remove any undissolved solid; (3)

drying the solid at a temperature that ensures complete removal of any residual solvent; and (4) weighing the amount of dried undissolved solid. Substracting the weight of undissolved solid from the original weight gives the amount of solid dissolved in the solvent. The specific solubility is generally expressed in grams of solid per unit weight (w/w) or volume (w/v) of solvent. When the solubility is known the relative amount (or percent) of a given solid in a specific solvent can be readily calculated.

Parameters affecting solubility can be varied in any suitable manner to determine the extent to which the binder resin, the dispersing agent, and the semiconductor material are soluble in a given solvent or solvents. For example, the temperature can be varied from room temperature (i.e., about 20 degrees C.) to the boiling point of the solvent. The elevated temperature can be applied for a time ranging for instance from about 1 minute to about 24 hours. The mixing time can vary for example from about 30 minutes to about one week.

The dispersion can be prepared by mixing and/or milling the organic semiconductor material and the continuous phase components in equipment such as paint shakers, ball mills, sand mills and attritors. Common grinding media such as glass beads, steel balls or ceramic beads may be used in this equipment. As an illustrative example, a typical, small-scale preparative process would entail charging a 1 oz glass jar, approximately ½ filled with ⅛ inch diameter stainless steel balls, with solvent (about 8 milliliters), binder resin (about 0.02 grams) and the organic semiconductor material (about 0.18 g). As described in "Handbook of Ball and Pebble Mill Operation" available from Paul O. Abbe Inc. Little Falls N.J., to ensure efficient dispersion, the total amount of charge (including balls) may fill the jar to about the ⅔ mark and the viscosity of the dispersion, may be for example from about 1000 to 2000 centipoise. If the dispersion viscosity is well outside this range the amount of solvent relative to the binder resin and semiconductor material should be appropriately adjusted. The jar would then be sealed and placed on a ball-milling apparatus at a rotation speed of from about 100 to 300 rpm for a period of from about 1 hour to about 7 days, depending on the desired degree of dispersion and final particle size of the dispersed phase. The milling is normally carried out at ambient temperatures although elevated temperatures, from about 30 to about 100° C. may be used, if desired. Optimized dispersion techniques using other types of equipment, such as Attritors, are generally described in literature supplied by vendors.

In embodiments, the semiconductor material (in the dispersion and the semiconductor layer) has a particle size ranging for example from about 10 nm to about 1,000 nm, particularly from about 50 nm to about 250 nm. The semiconductor material in embodiments, however, may have an initial particle size larger than desired. A smaller particle size may be desirable in embodiments so that thin semiconductor layers with a thickness of about 50 to about 150 nanometers can be satisfactorily formed. The present process optionally includes reducing the particle size of the semiconductor material prior to solution coating to achieve the desired particle size such as the particle sizes described herein. Any suitable technique can be used to reduce the semiconductor material particle size. For example, subjecting the dispersion to milling processes can be employed. Media grinding or milling is the process of size reduction of particles. In media milling, ball, pebbles or sand is used as the media in the stirred mixture with the material to be ground to reduce the particle size. Common methods of media milling include ball milling, attritor milling, sand milling. In each case, the media, typically larger than the material to be ground, is added to a container with the material to be ground. The entire collection is then stirred, shaken or otherwise agitated and the collisions of the media with the material results in breakage of the particles.

The present process then employs solution coating using the dispersion to form a semiconductor layer composed of the organic semiconductor material dispersed in the binder resin and the optional dispersing agent. The phrase "solution coating" refers to any suitable solution compatible coating technique for forming the semiconductor layer of an electronic device such as spin coating, blade coating, rod coating, screen printing, ink jet printing, stamping and the like. The solvent is then removed by allowing it to evaporate at a temperature ranging for example from about 20 to about 200 degrees C. either at atmospheric pressure or under vacuum for a time of from for example about 10 seconds to 24 hours. In embodiments, heating is used at the temperatures described herein to remove the solvent. The final dry thickness of the organic semiconductor layer is for example from about 10 nanometers to about 1 micrometer or for example from about 30 to about 150 nanometers.

In the dispersion and the semiconductor layer, the various components can be present in the following illustrative concentrations. The semiconductor material is present in an amount ranging for example from about 20% to about 99.5% by weight, particularly from about 60% to about 95% by weight, based on the total weight of the semiconductor material and the binder resin. The binder resin is present in an amount ranging for example from about 80% to less than about 1% by weight, particularly from about 40% to about 5% by weight, based on the total weight of the semiconductor material and the binder resin. The ratio of optional dispersing agent to binder resin can range from 0 to about 0.5 by weight. The solvent is present in an amount ranging for example from about 10% to about 95%, particularly from about 50% to about 90%, based on the total weight of the dispersion.

Suitable materials for the organic semiconductor material include n-type semiconductor materials (where conductivity is controlled by negative charge carriers) and p-type semiconductor materials (where conductivity is controlled by positive charge carriers). A single material or a mixture of two, three or more different materials can be used for the semiconductor material. N-type materials include for example perylene pigments such as N,N'dialkylperylene-3, 4,9,10-tetracarboxylic diimides, naphthalene-1,4,5,8-tetracarboxylic diimides, certain metal phthalocyanines, nitrofluorenones, substituted fluorene malononitrile adducts, halogenated anthanthrones, tris(8-hydroxyquinolinato) aluminum and oligomers and polymers containing such groups. P-type materials include for example pentacene, certain metal phthalocyanines, triarylamines, carbazoles, arylhydrazones and oligomers and polymers containing such structures, as well as polythiophenes, polyphenylvinylene, and polyvinylcarbazoles.

The binder resin functions as a matrix to hold the dispersed particles of the semiconductor material together and to ensure that the particles of the organic semiconductor material adhere firmly to the substrate and do not come off when, for example, the coated substrate is folded or rubbed. The binder resin may be selected for instance from a number of known oligomers and polymers such as poly(vinyl butyral), polyesters, polycarbonates, poly(vinyl chloride), polyacrylates and methacrylates, copolymers of vinyl chloride and vinyl acetate, phenoxy resins, polyurethanes, poly (vinyl alcohol), polyacrylonitrile, polystyrene, and the like. A single material or a mixture of two, three or more different materials can be used for the binder resin. In embodiments, the binder resin is a good film former, i.e., when the solvent evaporates from the coated dispersion the binder resin forms a smooth, continuous phase that adheres to the substrate and uniformly coats the particles of the semiconductor material. In embodiments, the binder resin may be electrically insulating and does not conduct charge in an electric field. In embodiments, the binder resin may also function as a dispersant for the particles of the semiconductor material by minimizing agglomeration, increasing the dispersion uniformity and preventing settling of the semiconductor material when the dispersion is stored.

In the event that the binder resin does not provide a stable dispersion of the semiconductor particles a dispersing agent optionally may be used in an amount of for example from about 0.1% to about 50% and especially from about 1% to about 10% of the weight of the binder resin. Many types of dispersing agents are known (as described, for example, in the book "McCutcheon's, Volume 1: Emulsifiers and Detergents", published annually by McCutcheon's division, M C Publishing Co., 175 Rock Road, Glen Rock, N.J., 07452) including non-ionic (e.g., ethoxylated long-chain alcohols, glyceryl stearate and alkanolamides), anionic (e.g., sodium lauryl sulfate, alkylnaphthalene sulfonates and aliphatic-based phosphate esters), cationic (e.g., trimethyl cetyl ammonium chloride, oleic imidazoline and ethoxylated fatty amines), and amphoteric (e.g., lecithin and polyglycol ether derivatives) surfactants and they can be monomers, oligomers or polymers. The optional dispersing agent serves to stabilize the dispersed semiconductor material against flocculation, aggregation or sedimentation and thereby maintains the dispersion in a finely divided state.

In embodiments of the present invention, it is desirable to select a solvent that does not disturb or adversely affect the other previously coated layers of the electronic device and in which the binder resin and optional dispersing agent are soluble and in which the organic semiconductor material is insoluble. Examples of solvents that can be selected are ketones, alcohols, esters, ethers, aromatic hydrocarbons, halogenated aliphatic and aromatic hydrocarbons and the like and mixtures thereof. Specific solvent examples are cyclohexanone, acetone, methyl ethyl ketone, methanol, ethanol, butanol, amyl alcohol, butyl acetate, dibutyl ether, tetrahydrofuran, toluene, xylene, chlorobenzene, carbon tetrachloride, chloroform, methylene chloride, trichloroethylene, and the like. A single material or a mixture of two, three or more different materials can be used for the solvent.

In embodiments, the present process may be used whenever there is a need to form a semiconductor layer in an electronic device. The phrase "electronic device" refers to micro- and nano-electronic devices such as, for example, micro- and nano-sized transistors and diodes. Illustrative transistors include for instance field effect transistors (particularly thin film organic transistors) and bipolar transistors.

In FIG. 1, there is schematically illustrated a thin film transistor ("TFT") configuration 10 comprised of a substrate 16, in contact therewith a metal contact 18 (gate electrode) and a layer of an insulating layer 14 on top of which two metal contacts, source electrode 20 and drain electrode 22, are deposited. Over and between the metal contacts 20 and 22 is an organic semiconductor layer 12 as illustrated herein.

Figure 2:
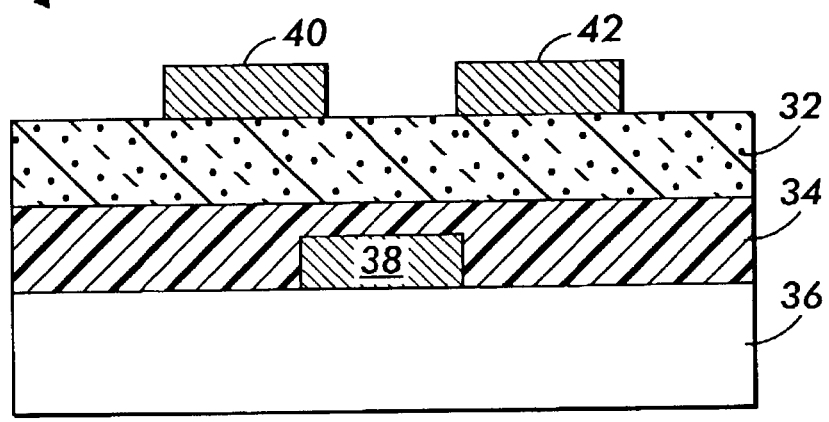
FIG. 2 represents a second embodiment of a field effect transistor made using the present process.

FIG. 2 schematically illustrates another TFT configuration 30 comprised of a substrate 36, a gate electrode 38, a source electrode 40 and a drain electrode 42, an insulating layer 34, and an organic semiconductor layer 32.

Figure 3:
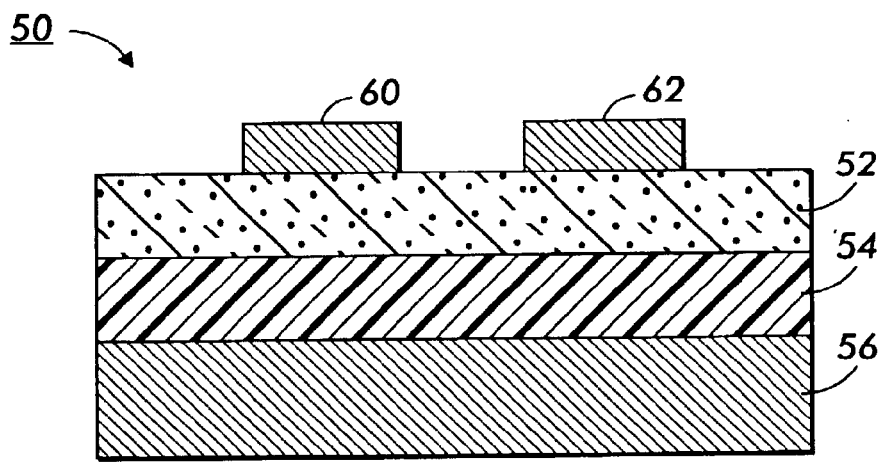
FIG. 3 represents a third embodiment of a field effect transistor made using the present process.

FIG. 3 schematically illustrates a further TFT configuration 50 comprised of a heavily n-doped silicon wafer 56 which acts as both a substrate and a gate electrode, a thermally grown silicon oxide insulating layer 54, and an organic semiconductor layer 52, on top of which are deposited a source electrode 60 and a drain electrode 62.

Figure 4:
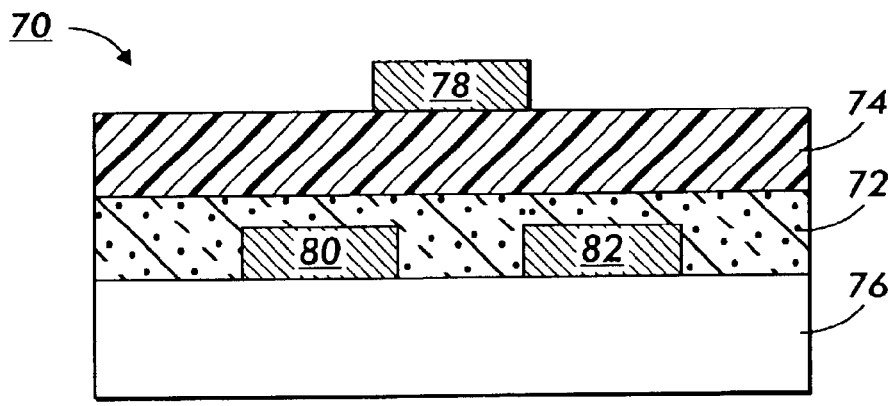
FIG. 4 represents a fourth embodiment of a field effect transistor made using the present process.

FIG. 4 schematically illustrates an additional TFT configuration 70 comprised of substrate 76, a gate electrode 78, a source electrode 80, a drain electrode 82, an organic semiconductor layer 72, and an insulating layer 74.

The composition and formation of the semiconductor layer are described herein.

The substrate may be composed of for instance silicon, glass plate, plastic film or sheet. For structurally flexible devices, plastic substrate, such as for example polyester, polycarbonate, polyimide sheets and the like may be preferred. The thickness of the substrate may be from amount 10 micrometers to over 10 millimeters with an exemplary thickness being from about 50 to about 100 micrometers, especially for a flexible plastic substrate and from about 1 to about 10 millimeters for a rigid substrate such as glass or silicon.

The compositions of the gate electrode, the source electrode, and the drain electrode are now discussed. The gate electrode can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as Electrodag available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors. The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 1 micrometer with the more specific thickness being about 100 to about 400 nanometers.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nanometers to about 500 nanometers depending on the dielectric constant of the dielectric material used. An exemplary thickness of the insulating layer is from about 100 nanometers to about 500 nanometers. The insulating layer may have a conductivity that is for example less than about $10^{-12}$ S/cm.

The insulating layer, the gate electrode, the semiconductor layer, the source electrode, and the drain electrode are formed in any sequence as long as the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

Regarding electrical performance characteristics, the semiconductor material (of the semiconductor layer) has a carrier mobility greater than for example about $10^{-3}$ cm$^2$/Vs (centimeters$^2$/Volt-second) and a conductivity less than for example about $10^{-5}$ S/cm (Siemens/centimeter). The field effect transistors produced by the present process have an on/off ratio greater than for example about $10^3$ at 20 degrees C. The phrase on/off ratio refers to the ratio of the source-drain current when the transistor is on to the source-drain current when the transistor is off.

A major advantage of the present invention is that it allows fabrication of electronic devices from materials which are typically insoluble, thus not coatable by solution coating methods or which do not form uniform thin films when solution or vacuum coated. The inventive method will also allow formation of electronic devices from materials that cannot be vacuum deposited. It also enables the use of specially-fabricated crystal forms of materials, such as phthalocyanines, that are known to exist in different solid state or polymorphic forms. A specific example would be the ability to coat either the α-, β- or X-polymorphic form of metal-free phthalocyanine. Such options do not exist with conventional solution or vacuum deposition coating techniques.

The invention will now be described in detail with respect to specific preferred embodiments thereof, it being understood that these examples are intended to be illustrative only and the invention is not intended to be limited to the materials, conditions, or process parameters recited herein. All percentages and parts are by weight unless otherwise indicated.

EXAMPLES

Preparation of Dispersion

Organic semiconducting materials were purified by a sublimation process. The sublimation process is described in U.S. Pat. Nos. 4,952,471 and 4,952,472. The fractional sublimation process involves passing a carrier gas over the material in a glass tube situated in an oven which had a temperature gradient. Sublimation of the material resulted in vapor at the high temperature zone, which vapor was then carried to downstream and condensed to form solid deposits at the lower temperature zones. The desired sublimed material was deposited at the medium temperature zone and the more volatile impurities at the low temperature zone. A separation of impurities from the sublimed material was achieved. In this example of the semiconductor material used to prepare the dispersion, dibromoanthanthrone was purified by fractional sublimation, which involved subjecting this material to a temperature of from about 150 degrees to 350 degrees C., whereby impurities and decomposition products more volatile than the desired components are separated at a temperature zone of below 200 degrees C. There are thus obtained the desired purified dibromoanthanthrone at a temperature zone of from about 250 degrees to 300 degrees C. separated from the nonvolatile impurities, which remain at the high temperature (350 degrees C.) zone. About 0.50 gram of the fractionally sublimed dibromoanthanthrone was mixed with about 0.06 gram of polyvinylbutyral resin (molecular weight of about 30,000 to about 100,000; acid free with less than about 0.003% HCl) and 7.5 grams of cyclohexanone in a 30 milliliter glass bottle containing 70 grams of ⅛ inch diameter stainless steel balls. The bottle was placed on a roll mill and milled at a speed of about 250 rpm for 24 hours.

Fabrication of Thin Film Field Effect Transistors (Thin Film FETs)

The test device was comprised of a n-doped silicon substrate with a thermally grown silicon oxide layer of a thickness of about 300 nanometers. The substrate functioned as the gate electrode while the silicon oxide layer acted as the gate dielectric and had a capacitance of about 13 nF/cM$^2$. The silicon substrate was initially cleaned with methanol, air dried and then immersed in a 0.01 M solution of 1,1,1,3,3,3-hexamethyldisilazane in dichloromethane for 30 minutes at room temperature (about 20 degrees C.). Subsequently, the substrate was washed with dichloromethane and dried. The semiconductor layer was deposited on top of the silicon oxide layer by spin coating the dispersion of dibromoanthanthrone prepared as described earlier. Spin coating was done at a speed of 2000 rpm for 60 seconds and dried in a vacuum oven at 80 degrees C. for 20 hours. The thickness of the semiconductor layer was about 100 nm. Source and drain electrodes were deposited by vacuum evaporation of gold through a metal mask with various channel lengths ranging from 60 to 370 micrometers and widths of 1 mm and 5 mm. This allowed the fabrication of 14 thin film FETs of various dimensions.

Evaluation of Thin Film FETs

The evaluation of thin-film transistor performance was accomplished in a black box at ambient conditions using a Keithley 4200 SCS semiconductor characterization system. The carrier mobility, μ, was calculated from the data in the saturated regime (gate voltage $V_G$<source-drain voltage Vsd) according to equation (1):

$$I_{SD}=C_i\mu(W/2L)(V_G-V_T) \quad (1)$$

where $I_{SD}$ is the drain current in the saturated regime, $C_i$ is the capacitance per unit area of the gate dielectric layer, W and L are the semiconductor channel width and length respectively and $V_G$ and $V_T$ are the gate voltage and threshold voltage respectively. The threshold voltage was determined from a plot of the square root of $I_{SD}$ in the saturated regime and the gate voltage $V_G$ by extrapolating the straight line to $I_{SD}$=0. The calculation of the mobility and the threshold voltage are known in the literature and to those skilled in the art.

Results

The drain current versus gate voltage characteristics indicated that the drain current was low, about $10^{-12}$ A to $2\times10^{-14}$ A, when the gate voltage was negative (about −10V to −40V) and increased with increasing gate voltage attaining saturation for positive gate voltages, about 60V to 80V. This was indicative of a thin film transistor with a n-type semiconductor. The mobility in the saturation regime was determined to be $2\times10^{-5}$ cm$^2$/V.s and the ratio of the maximum drain current to the minimum drain current (On/Off ratio) was determined to be about $10^6$.

We claim:

1. A field effect transistor comprising:
   an insulating layer;
   a gate electrode;
   a semiconductor layer including an organic semiconductor material and a binder resin;
   a source electrode; and
   a drain electrode,
   wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer.

2. The field effect transistor of claim 1, wherein the semiconductor layer further comprises a dispersing agent.

3. The field effect transistor of claim 1, wherein the semiconductor layer further comprises a dispersing agent that is present in an amount ranging from about 0.1% to about 50% of the weight of the binder resin.

4. The field effect transistor of claim 1, wherein the semiconductor layer further comprises a dispersing agent that is present in an amount ranging from about 1% to about 10% of the weight of the binder resin.

5. The field effect transistor of claim 1, wherein the organic semiconductor material in the semiconductor layer has a particle size ranging from about 10 nm to about 1,000 nm.

6. The field effect transistor of claim 1, wherein the organic semiconductor material in the semiconductor layer has a particle size ranging from about 50 nm to about 250 nm.

7. The field effect transistor of claim 1, wherein the organic semiconductor material is a n-type material.

8. The field effect transistor of claim 1, wherein the organic semiconductor material is dibromoanthanthrone and the resin binder is polyvinylbutyral.

9. The field effect transistor of claim 1, wherein the organic semiconductor material is a p-type material.

10. The field effect transistor of claim 1, wherein the organic semiconductor material is present in the semiconductor layer in an amount ranging from about 20% to about 99.5% by weight based on the total weight of the organic semiconductor material and the binder resin.

11. The field effect transistor of claim 1, wherein the organic semiconductor material is present in the semiconductor layer in an amount ranging from about 60% to about 95% by weight based on the total weight of the organic semiconductor material and the binder resin.

12. The field effect transistor of claim 1, wherein the binder resin is present in the semiconductor layer in an amount ranging from about 80% to less than about 1% by weight based on the total weight of the organic semiconductor material and the binder resin.

13. The field effect transistor of claim 1, wherein the binder resin is present in the semiconductor layer in an amount ranging from about 40% to about 5% by weight based on the total weight of the organic semiconductor material and the binder resin.

14. The field effect transistor of claim 1, wherein the source electrode and the drain electrodes have a thickness ranging from about 40 nm to about 1 micrometer.

* * * * *

UNITED STATES PATENT AND TRADEMARK OFFICE
CERTIFICATE OF CORRECTION

PATENT NO.        : 6,774,393 B2                                        Page 1 of 1
APPLICATION NO.  : 10/397561
DATED             : August 10, 2004
INVENTOR(S)       : Murti et al.

It is certified that error appears in the above-identified patent and that said Letters Patent is hereby corrected as shown below:

In column 1, line 9, the following should be added before the title "BACKGROUND OF THE INVENTION":

--STATEMENT REGARDING FEDERALLY SPONSORED RESEARCH OR DEVELOPMENT
  This invention was made with United States Government support under Cooperative Agreement No. 70NANBOH3033 awarded by the National Institute of Standards and Technology (NIST). The United States Government has certain rights in the invention.--

Signed and Sealed this

Twentieth Day of February, 2007

JON W. DUDAS
*Director of the United States Patent and Trademark Office*

UNITED STATES PATENT AND TRADEMARK OFFICE
CERTIFICATE OF CORRECTION

PATENT NO. : 6,774,393 B2
APPLICATION NO. : 10/397561
DATED : August 10, 2004
INVENTOR(S) : Murti et al.

It is certified that error appears in the above-identified patent and that said Letters Patent is hereby corrected as shown below:

In the Specification

In column 1, line 9, the following should be added before the title "BACKGROUND OF THE INVENTION":

--STATEMENT REGARDING FEDERALLY SPONSORED RESEARCH OR DEVELOPMENT
   This invention was made with United States Government support under Cooperative Agreement No. 70NANB0H3033 awarded by the National Institute of Standards and Technology (NIST). The United States Government has certain rights in the invention.--

This certificate supersedes the Certificate of Correction issued February 20, 2007.

Signed and Sealed this
Tenth Day of September, 2013

Teresa Stanek Rea
*Acting Director of the United States Patent and Trademark Office*